(12) United States Patent
Cheng et al.

(10) Patent No.: US 6,512,390 B1
(45) Date of Patent: Jan. 28, 2003

(54) DETECTING DEVICE FOR A SWITCH MATRIX

(75) Inventors: Chih-Nan Cheng, I-Lan Hsien (TW); Tong-Sheng Lee, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 87 days.

(21) Appl. No.: 09/670,385

(22) Filed: Sep. 28, 2000

(51) Int. Cl.[7] .......................... G01R 31/26; G01R 31/02

(52) U.S. Cl. ....................................... 324/756; 324/765

(58) Field of Search ..................... 438/14, 17; 324/537, 324/754, 755, 756, 759, 761, 765

(56) References Cited

U.S. PATENT DOCUMENTS 4,488,111 A * 12/1984 Widdowson ............ 324/158 F
5,436,554 A * 7/1995 Decker, Jr. .................. 324/66

OTHER PUBLICATIONS

Fairchild Semiconductor Corporation, "Device Generated Noise Measurement Techniques", Nov. 1990, Data Sheet AN–737, 7 pages.*

* cited by examiner

Primary Examiner—Michael Sherry
Assistant Examiner—Evan Pert
(74) Attorney, Agent, or Firm—Winston Hsu

(57) ABSTRACT

A device and a method for testing a switch matrix used in semiconductor equipment and its ring connector are provided by the present invention. The switch matrix contains a test fixture adapter and the ring connector, and the ring connector comprises a plurality of first connecting pins on one end of the ring connector. The method is to first place a probe board on the test fixture adapter, and a plurality of testing pins are positioned on the probe board, each of the testing pins having one corresponding first connecting pin. Then, a resistor is electrically connecting between each of two adjacent testing pins, and electrically connecting the first connecting pins with the corresponding testing pins. Finally, a testing circuit is used to test each of the resistors so as to judge the operations of the switch matrix.

9 Claims, 3 Drawing Sheets

DETECTING DEVICE FOR A SWITCH MATRIX

BACKGROUND OF THE INVENTION

1. Field of the Invention

The present invention relates to a device for testing a switch matrix used in semiconductor processing equipment, and more particularly, to a device for testing a ring connector of the switch matrix, and its testing method.

2. Description of the Prior Art

In semiconductor manufacturing processes, when a wafer process (for example, a thin film deposition, a doping process, etc.) has been finished, an electrical property testing of the wafer is performed. Afterwards, cutting and packaging processes are performed on those wafers which pass the quality control testing procedures. The electrical property testing for wafers is used to distinguish between good and bad wafers, and to ensure the proper electrical functioning of the semiconductor devices. Additionally, the feedback of test results from wafer testing serves as process data to enhance the process yield and the process reliability of the production line.

A switch matrix is a device frequently used for testing wafers in the semiconductor processing industry. In the testing method, a wafer is placed on a testing platform, and then the electrical property of the wafer is detected by contact probes. When the probes touch the wafer, the electrical properties of the wafer must conform to a predetermined standard in the program in the control unit. If the wafer does not conform to these standards, the wafer is considered defective and is eliminated. Through the operation of the switch matrix, probes can be arrayed as a matrix, and are used to detect the electrical properties of wafers a unit at a time.

In the prior art, a testing device with a switch matrix includes a test fixture adapter, a ring connector, and a test fixture as primary components. The test fixture contains a personality board, and the ring connector comprises a plurality of first connecting pins and a plurality of second connecting pins on two ends of the ring connector. The first connecting pins are used to connect to the test fixture adapter, and the second connecting pins are used to connect to the personality board. In the prior art, wafer testing proceeds by placing the wafer on the joint pad of the test fixture adapter, and then the ring connector is used to connect the test fixture adapter to the test fixture. In other words, the test fixture, the ring connector and the test fixture adapter are first connected, and then probes are used to detect the electrical properties of each wafer.

In the testing device with a switch matrix according to the prior art, the ring connector is used to electrically connect the test fixture adapter to the test fixture. The ring connector usually has two ends as mentioned above, and it has different numbers of connecting pins on the two ends. The function of the ring connector is to connect together two mechanisms that have different numbers of pins, for example, converting sixty pins to forty-eight pins. Hence, the two ends of the ring connector are connected together by many wires. But in the wafer testing process of the prior art, if a certain in or a certain connecting wire of the ring connector breaks, determining where the problem has occurred and solving the problem cannot be effected immediately. The whole detecting device must be shut down, and a self-testing program provided by the device factory must be executed, or the problem checked out manually. These methods do not proceed easily and they consume a great deal of both time and money, and subject the whole testing process to delays.

SUMMARY OF THE INVENTION

It is an object of the present invention to provide a device and a method for testing the switch matrix and the ring connector used in semiconductor equipment and to solve the above-mentioned problems of the prior art.

In a preferred embodiment of the present invention, the switch matrix contains a test fixture adapter and a ring connector. The ring connector has a plurality of first connecting pins on one end. The method is to place a probe board on the test fixture adapter first, a plurality of testing pins are positioned on the probe board, each of the testing pins having one corresponding first connecting pin. Then a resistor is electrically connected between each of two adjacent testing pins, and the first connecting pins are electrically connected with the corresponding testing pins. Finally, a testing circuit is used to test each of the resistors so as to judge the operations of the switch matrix.

It is an advantage of the present invention that problems with the ring connector can be found and solved quickly by connecting a resistor between each testing pin and by utilizing predetermined programs for testing circuit.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
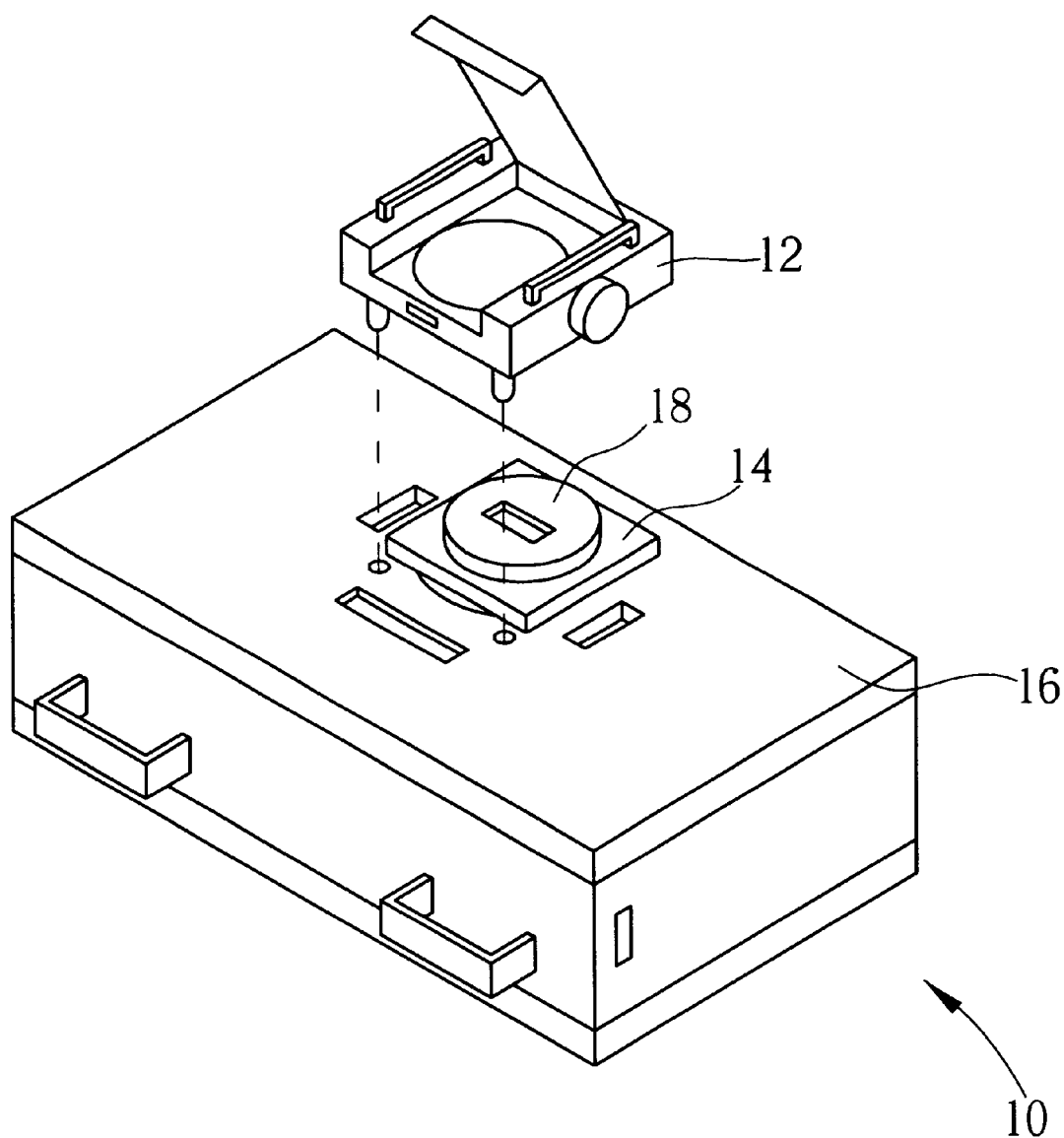
FIG. 1 is a perspective view diagram of a testing device with a switch matrix according to the present invention.
Figure 2:
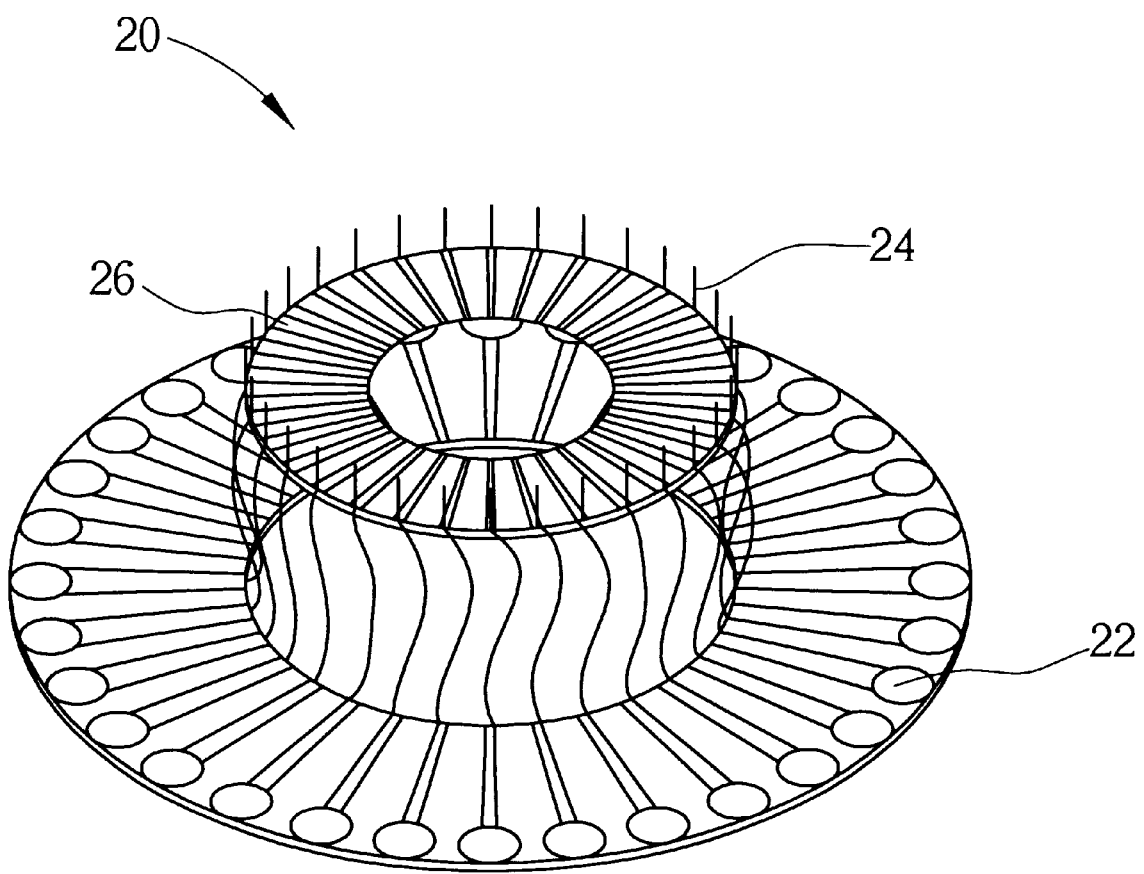
FIG. 2 is perspective view diagram of a ring connector in the testing device with a switch matrix according to the present invention.

Please refer to FIG. 1 and FIG. 2. FIG. 1 is a perspective view diagram of a testing device 10 with a switch matrix according to the present invention. FIG. 2 is a perspective view diagram of a ring connector 20 in the testing device 10 according to the present invention. As shown in FIG. 1, the device 10 contains a test fixture adapter 12, a test fixture 14 and a test platform 16 as primary components. The test fixture 14 contains a personality board 18.

As shown in FIG. 2, a plurality of first connecting pins 22 and a plurality of second connecting pins 24 are positioned on two ends of the ring connector 20, respectively. The first connecting pins 22 are used to connect to the test fixture adapter 12, and the second connecting pins 24 are used to connect the personality board 18.

The ring connector 20 of the detecting device 10 is used to electrically connect the test fixture adapter 12 to the test fixture 14. The ring connector 20 has different numbers of connecting pins on its two ends. The ring connector 20 connects together two mechanisms that have different numbers of pins, for example, converting a sixty pin connection to a forty-eight pin connection. Hence, the two ends 22, 24 of the ring connector 20 are connected together by many wires 26.

When testing wafers, first the predetermined wafer to be tested is placed on the joint pad of the test fixture adapter 12, and then the test fixture adapter 12 is connected together with the test fixture 14 by the ring connector 20. In other words, the test fixture 14, the ring connector 20 and the test fixture adapter 12 are first connected together, and then probes are used to detect the electrical properties of each wafer.

Figure 3:
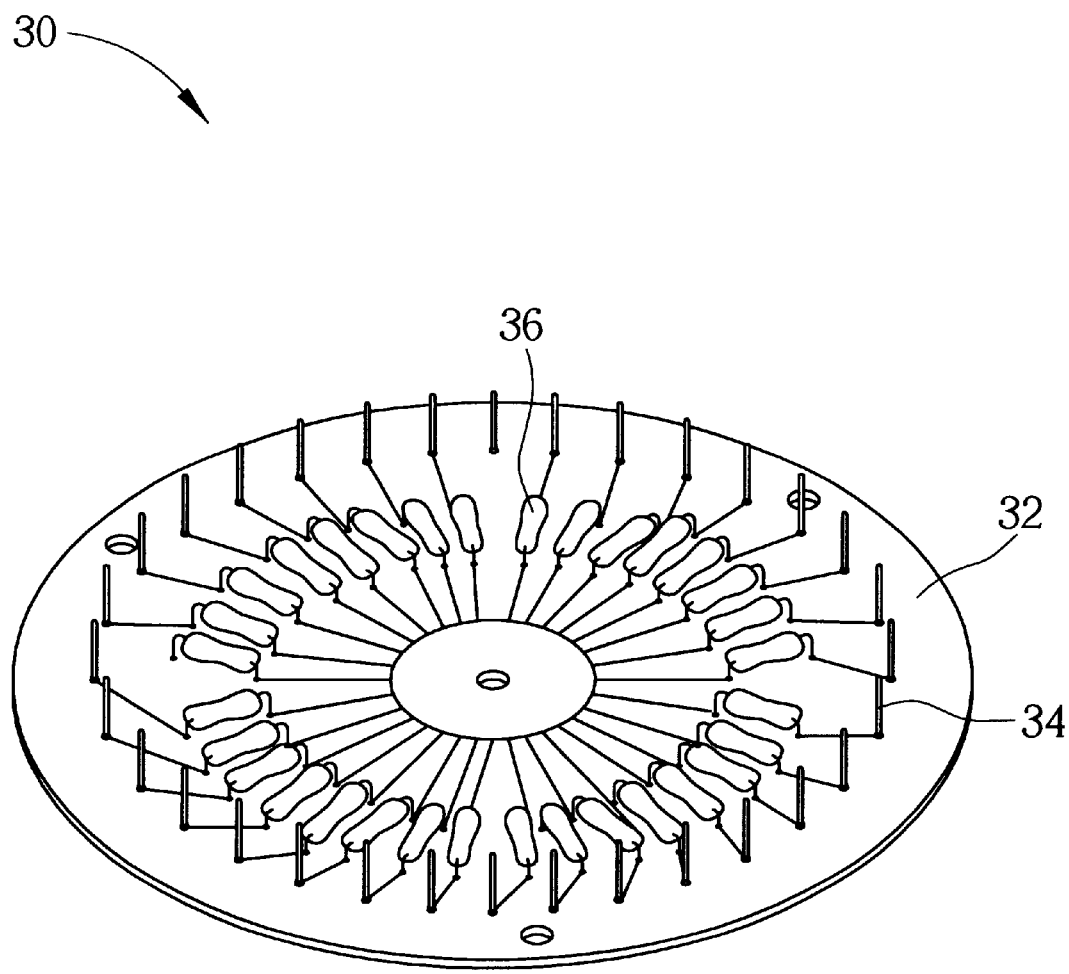
FIG. 3 is a perspective view diagram of a detecting device according to the present invention.

Please refer to FIG. 3. FIG. 3 is a perspective view diagram of a detecting device 30 according to the present invention. The detecting device 30 comprises a probe board 32, a plurality of testing pins 34 and plurality of resistors 36. The shape of the probe board 32 corresponds to the shape of the test fixture adapter 12 so that the detecting device 30 can be placed on the test fixture adapter 12 in the position where wafers are placed to be tested. The testing pins 34 are positioned on the probe board 32 and the number of testing pins 34 corresponds to the number of first connecting pins 22 of the ring connector 20. A 100 ohm resistor connects together two adjacent testing pins in the present invention; of course, other types of resistors may be used, or even multiple resistors may be used.

The detecting device 30 contains a testing circuit (not shown), and the testing circuit comprises a memory and a control unit. A predetermined program is installed in the memory, and the control unit tests the ring connector 20 using the predetermined program to find any faulty pins 22, 24 or wires 26.

The testing method in the present invention involves first placing the probe board 32 of the detecting device 30 on the test fixture adapter 12. Each first connecting pin 22 on the ring connector 20 is thus connected with each corresponding testing pin 34 on the probe board 32. The testing circuit is then used to induce a voltage across the resistor 36 between two adjacent testing pins 34, and the current passing through the resistor 36 is measured. Ohm's Law is then used to judge the electrical function of pins 22, 24 and wires 26 in the ring connector 20 by comparing the measured current with the known voltage and resistance.

If a certain pin or a certain connecting wire of the ring connector 20 is faulty when undergoing testing by the testing process of the present invention by using the detecting device 30, the problem can be detected and solved immediately. The detecting device 30 of the present invention is simply designed, and any problem points in the ring connector 20 can be found easily by the predetermined program in conjunction with Ohm's Law and the testing circuit. The factory-provided program, which is complex and wastes a lot of time, does not need to be executed, nor does each pin and wire need to be checked by hand. Hence, delay-induced costs are significantly reduced, and the entire testing process proceeds much more smoothly.

In contrast to the prior method for manually detecting breakdown points in the ring connector, the detecting device and method provided by the present invention can quickly find problems in the ring connector by utilizing resistors connected with each testing pin and the predetermined program in the testing circuit. Consequently, overall throughput is increased.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A detecting device for testing a ring connector of a switch matrix used in semiconductor equipment, the switch matrix comprising a test fixture adapter and the ring connector, the ring connector comprising a plurality of first connecting pins on a first end of the ring connector, the detecting device comprising:
    a probe board, the shape of the probe board corresponding to the shape of the test fixture adapter;
    a plurality of testing pins positioned on the probe board, each of the testing pins having one corresponding first connecting pin; and
    a plurality of resistors, each of the resistors being electrically connected between two adjacent testing pins.

2. The detecting device of claim 1 wherein the switch matrix further comprises a test fixture, and a personality board positioned on the test fixture, the test fixture and the test fixture adapter respectively connecting to each end of the ring connector when the ring connector is tested by the detecting device.

3. The detecting device of claim 2 wherein the ring connector further comprises a second end, and a plurality of second connecting pins are positioned on the second end and are connected to the personality board.

4. The detecting device of claim 1 wherein the detecting device further comprises a testing circuit, the testing circuit connected to two adjacent testing pins, and the testing circuit uses each of the resistors to test the ring connector.

5. The detecting device of claim 4 wherein the testing circuit comprises a memory and a control unit, a predetermined program being installed in the memory, and the control unit detects the ring connector using the predetermined program to find faulty pins.

6. A method for testing a switch matrix used in semiconductor equipment, the switch matrix comprising a test fixture adapter and a ring connector, the ring connector comprising a plurality of first connecting pins on a first end of the ring connector, the method comprising:
    placing a probe board on the test fixture adapter, the probe board comprising a plurality of testing pins, each of the testing pins having one corresponding first connecting pin;
    electrically connecting a resistor between each of two adjacent testing pins;
    electrically connecting the first connecting pins with the corresponding testing pins; and
    using a testing circuit to test each of the resistors so as to judge the operations of the switch matrix.

7. The method of claim 6 wherein the switch matrix further comprises a test fixture, and a personality board positioned on the test fixture, the test fixture and the test fixture adapter respectively connecting to each end of the ring connector when testing the switch matrix.

8. The method of claim 7 wherein the ring connector further comprises a second end, and a plurality of second connecting pins are positioned on the second end and are connected to the personality board.

9. The method of claim 6 wherein the testing circuit comprises a memory and a control unit, a predetermined program being installed in the memory, and the control unit tests the ring connector using the predetermined program to find faulty pins.

* * * * *